United States Patent [19]
Bourez et al.

[11] Patent Number: 5,512,150
[45] Date of Patent: Apr. 30, 1996

[54] TARGET ASSEMBLY HAVING INNER AND OUTER TARGETS

[75] Inventors: Allen J. Bourez; Brij B. Lal, both of San Jose; Michael A. Russak, Los Gatos, all of Calif.

[73] Assignee: HMT Technology Corporation, Fremont, Calif.

[21] Appl. No.: 401,449

[22] Filed: Mar. 9, 1995

[51] Int. Cl.⁶ .................................................. C23C 14/35
[52] U.S. Cl. ............................ 204/192.2; 204/192.12; 204/192.15; 204/298.08; 204/298.17; 204/298.16; 204/298.17; 204/298.19
[58] Field of Search ..................... 204/192.12, 192.15, 204/192.2, 298.06, 298.08, 298.12, 298.16–298.19

[56] References Cited

U.S. PATENT DOCUMENTS

| | | | |
|---|---|---|---|
| 4,569,746 | 2/1986 | Hutchinson | 204/298.09 |
| 4,604,180 | 8/1986 | Hirukawa et al. | 204/298 |
| 4,610,774 | 9/1986 | Sakata et al. | 204/298.12 |
| 4,761,218 | 8/1988 | Boys | 204/298.19 |
| 4,957,605 | 9/1990 | Hurwitt et al. | 204/192.12 |
| 5,174,880 | 12/1992 | Bourez et al. | 204/298.17 |
| 5,366,607 | 11/1994 | Lal et al. | 204/298.19 |

*Primary Examiner*—Aaron Weisstuch
*Attorney, Agent, or Firm*—Judy M. Mohr; Peter J. Dehlinger

[57] ABSTRACT

A target assembly for use in fabricating magnetic recording media is described. The target assembly has inner and outer concentric targets for sputter depositing on a substrate first and second layers having different compositions. Disposed adjacent each target is a magnetic means, and at least one which is reversible in magnetic-pole polarity. One polarity produces a magnetic flux sufficient to ignite a sputtering plasma in the inner target only, when power is supplied to the inner target at a preselected level. The opposite polarity produces a magnetic flux sufficient to ignite a sputtering plasma in the outer target only, when power is supplied to the outer target at a preselected level.

17 Claims, 10 Drawing Sheets

TARGET ASSEMBLY HAVING INNER AND OUTER TARGETS

FIELD OF THE INVENTION

The present invention relates to a target assembly and its method of use for forming a multilayer magnetic recording medium. The target assembly has inner and outer targets for depositing sputtered layers onto a substrate.

REFERENCES

Bourez, A., et al., U.S. Pat. No. 5,174,880, issued Dec. 29, 1992.

Lal, B., et al., U.S. Pat. No. 5,366,607, issued Nov. 22, 1994.

Hata, H., et al., *J. Appl. Phys.*, 67(9):4692 (1990a).

Hata, H., et al., *IEEE Trans. Magn.*, 26(5):2709 (1990b).

Cord, B., et al., *IEEE Trans. Magn.*, 29:3694 (1993).

Katayama, S., et al., *IEEE Trans. Magn.*, 24(6):2982 (1988).

Ranjan, R., et al., *J. Applied Phys.*, 69(8):4727 (1991).

BACKGROUND OF THE INVENTION

Magnetic recording media are typically formed on a substrate, such as a nickel-plated aluminum substrate, and deposited on the substrate are a plurality of layers, such as a chromium underlayer, a magnetic recording layer, and a protective overcoat. The magnetic recording layer may be formed of multiple magnetic films separated by a non-magnetic isolation layer, such as a thin chromium interlayer (Katayama, WP, Hata).

Typically, magnetic recording media are formed in a sputtering apparatus having a series of sputtering chambers, each with a sputtering target for material deposition. A substrate is placed in a first sputtering chamber, and a film or layer is deposited onto the substrate. The coated substrate is then shuttled to the next sputtering chamber, downstream from the first chamber, where another layer is deposited. The coated substrate is moved progressively from one chamber to the next for sputter deposition of each layer in the medium.

This process of fabricating media requires a plurality of sputtering chambers, one for each layer deposited. Depending on the number of layers in the medium and the composition of each layer, the number of chambers required may exceed the number in a typical sputtering apparatus.

Another drawback to this method of sputtering is the large inventory of materials, such as sputtering targets, needed. This is especially the case where a medium having two layers formed of the same material is formed by sputtering that material in separate chambers; each chamber requiring a sputtering target.

Another disadvantage to sputtering multiple layers in separate sputtering chambers is the dwell time of the substrate, that is the time between completing sputtering in one chamber and beginning sputtering in the next chamber. The substrate cools during this time, and the first layers are deposited at higher substrate temperatures than later layers in the medium. The different deposition temperatures affects the magnetic recording properties of the medium, especially for magnetic layers. Media having magnetic layers sputtered at higher temperatures have a higher coercivity than media having magnetic layers deposited at lower temperatures (Cord).

SUMMARY OF THE INVENTION

In one aspect, the invention includes a target assembly for use in forming on a substrate, first and second sputter-deposited layers having different compositions. The assembly has inner and outer concentric targets for sputter depositing layers on the substrate.

Adjacent an inner annular portion of the inner target is an inner magnetic means, and the magnetic poles of the inner magnetic means have a substantially axial magnetic pole orientation.

An outer magnetic means is disposed adjacent the outer target and an outer annular region of the inner target. The outer magnetic means have a substantially radial magnetic pole orientation.

At least one of said magnetic means is reversible in magnetic-pole polarity, wherein one polarity produces a magnetic flux sufficient to ignite a sputtering plasma in the inner target only, when power is supplied to the inner target at a preselected level. The opposite polarity produces a magnetic flux sufficient to ignite a sputtering plasma in the outer target only, when power is supplied to the outer target at a preselected level.

In one embodiment, the inner magnetic means is a permanent magnet and the outer magnetic means is an electromagnet. In this embodiment, the electromagnet in one polarity has a current of between 0.1 and 1.0 amp, and in the opposite polarity has a current of between 1.0 and 5.0 amps.

Preferably, the inner target is composed of chromium and the outer target is composed of a cobalt-based alloy.

In another embodiment, the outer target further includes an inner ring and an outer ring, both formed of substantially the same material as the target. The inner ring is positioned adjacent an inner annular region of the outer target, and the outer ring is positioned adjacent an outer annular region. Preferably, an outer annular portion of the inner target is disposed adjacent an upper annular portion of said inner ring.

The target assembly may also include a means for placing a negative bias of between −50 to −500 volts on the substrate during sputter deposition of the layers.

The invention, in another aspect, includes a method of forming on a substrate by sputter deposition, alternating layers of two different compositions. The method includes placing the substrate in a sputtering chamber having a target assembly with inner and outer concentric targets. Disposed adjacent the inner and outer targets, respectively, are inner and outer magnetic means, where at least one of the magnetic means is reversible in magnetic-pole polarity. One polarity produces a magnetic flux sufficient to ignite a sputtering plasma in the inner target only, and the opposite polarity produces a magnetic flux sufficient to ignite a sputtering plasma in the outer target only.

The method also includes orienting the polarity of one of the magnetic means to achieve ignition of a sputtering plasma in the inner target, when power is supplied to the inner target at a preselected level of, preferably, between 0.3 and 1.0 KW. A layer is sputtered onto the substrate from the inner target.

The polarity of the one magnetic means is reversed to achieve ignition of a sputtering plasma in the outer target, when power is supplied to the outer target at a preselected level. A layer is sputtered from the outer target directly on the layer sputtered from the inner target.

In one embodiment, the polarity of one of the magnetic means is oriented by controlling a coil current amperage and direction in the outer magnetic means. The outer magnetic means may be an electromagnet, and the coil current amperage of the electromagnet is adjusted to a current between about 0.1–1.0 amp to achieve ignition of the inner target.

For ignition of the outer target, the magnetic polarity of the electromagnet is reversed, and the coil current amperage is adjusted to a current between about 1.0–5.0 amps. Preferably, the power supplied to the outer target is at a preselected level in the range 1.0–2.5 KW.

In a preferred embodiment, the inner target is composed of chromium, and sputtering from the inner target is effective to deposit a chromium underlayer and a chromium interlayer in a magnetic recording medium. The outer target is composed of a cobalt-based alloy. Sputtering from the inner and outer targets, in an alternating fashion, is effective to form a magnetic recording medium having at least two magnetic thin-film layers separated by a chromium interlayer layer having a thickness of between 5–50 Å.

These and other objects and features of the invention will be more fully appreciated when the following detailed description of the invention is read in conjunction with the accompanying drawings.

DETAILED DESCRIPTION OF THE INVENTION

Section I below describes the target assembly of the present invention and, in Section II, the operating characteristics of the target assembly are described. Sections III and IV describe, respectively, a method of forming a magnetic recording medium using the assembly of the invention, and recording characteristics of such a medium.

I. Target Assembly

Figure 1:
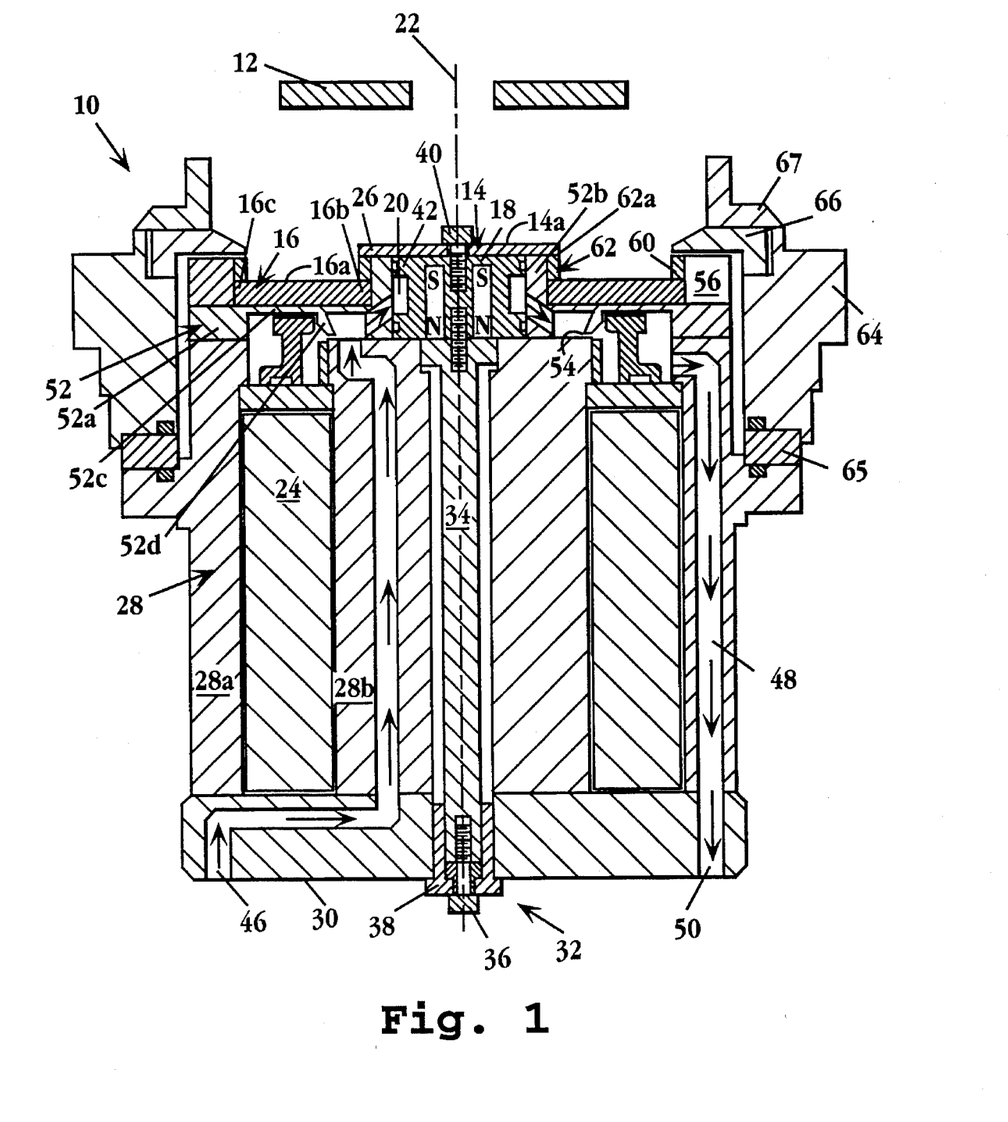
FIG. 1 is a cross section of a target assembly constructed according to the invention.

FIG. 1 shows in cross sectional view an annular target assembly 10 positioned in a sputtering chamber (not shown) in an in-line, pass-by sputtering apparatus for use in forming a thin-film recording medium. It will be appreciated that a similar target assembly may be positioned "above" assembly 10 for sputtering a desired film onto the upper and lower sides of a substrate 12 positioned between the confronting target assemblies.

Target assembly 10 includes inner and outer concentric sputtering targets 14, 16 having planar, annular sputtering surfaces 14a and 16a, respectively.

Inner target 14 is formed of a nonmagnetic material, such as chromium or a chromium-based alloy, such as CrV, CrGd, or CrSi, and typically has an outer diameter of about 2.25 inches, an inner diameter of about 0.19 inch, and is approximately 0.125 inch in thickness.

Outer target 16 is formed of a magnetic material, preferably a cobalt-based alloy, as described below. Typical dimensions for the outer target are 5 inches in outer diameter, 2 inches in inner diameter, with a thickness of about 0.25 inch.

Disposed adjacent an inner annular portion 18 of the inner target is a permanent magnet 20 having poles, such as a north pole and a south pole designated in FIG. 1, according to convention, as N and S, respectively. Permanent magnet 20 is positioned with its magnetic poles in a substantially axial orientation with respect to the central axis of the target assembly, represented by axis 22. As shown here, the magnet is positioned such that the south pole is nearer inner target 14 than is the north pole. A magnetic field is produced over target surface 14a, as discussed below with respect to FIG. 2, that serves to confine the sputtering plasma to a defined region about the target surface for deposition of material onto substrate 12.

It will be appreciated that permanent magnet 20 may also be an electromagnet, or other suitable magnetic means. An inner magnetic means, as referred to herein, refers to such a permanent magnet, or an electromagnet, disposed adjacent the inner annular portion of the inner target.

An electromagnetic coil assembly 24, also referred to herein as outer magnetic means, is disposed adjacent outer target 16 and an outer annular portion 26 of inner target 14. Electromagnet 24 is oriented with its magnetic poles substantially radial to the central axis of the target assembly. When the coil assembly of electromagnet 24 is energized, a magnetic field is generated, as will be described with respect to FIG. 2, that serves to confine the sputtering plasma to a defined region about outer target surface 16a for deposition on substrate 12.

The outer magnetic means is housed in a pole weldment assembly 28, including an outer cylindrical pole piece 28a and an inner cylindrical pole piece 28b, having a smaller diameter than the outer pole piece. The inner and outer pole pieces are formed of a material, such as 410 stainless steel, that is suitable for conducting magnetic flux, as will be discussed below.

According to an important feature of the invention, at least one of the magnetic means, that is, either the inner magnetic means or the outer magnetic means, is reversible in magnetic polarity. In a preferred embodiment, described in more detail in FIGS. 2 and 3, the inner magnetic means is a permanent magnet, having an axial magnetic pole orientation with the south pole closer to the inner target, as illustrated in FIG. 1. The outer magnetic means is an electromagnet where the polarity is reversible by changing the direction of the applied current, by means of a relay switch or the like, as will be described. One polarity produces a magnetic flux that is sufficient to ignite a sputtering plasma in the inner target only, when power is applied to the target at a preselected level. The opposite polarity produces a magnetic flux sufficient to ignite a sputtering plasma in the outer target only, when power is supplied to the target at a preselected level.

With continuing reference to FIG. 1, a rear pole 30 caps the pole weldment assembly and is held in place by an end assembly 32. End assembly 32 includes a central pole 34 secured at one end by a screw 36 and a pole cap 38.

At the opposite end of the central pole, a screw 40 secures the central pole and the inner target. Inner target 14 abuts a cooling, backing plate 42, made of a material with a high heat transfer coefficient, such as copper. As seen, screw 40, which is formed of stainless steel, fixes the inner target to the backing plate. The target may also be bonded to the backing plate with a suitable adhesive.

Outer target 16 abuts a circular backing plate 52, which forms part of the inner and outer pole pieces of the pole weldment assembly for conducting magnetic flux. The backing plate includes an outer portion 52a, an inner portion 52b, and an intermediate portion 52c. Extending downward toward inner pole piece 28b is an annular shunt portion 52d. The shunt portion preferably does not quite touch inner pole piece 28b, defining a gap 54 between the two pieces. The gap and the shape and size of the shunt portion are used to control the amount of flux conducted through the shunt portion, as described in U.S. Pat. No. 5,174,880, which is incorporated by reference herein.

On top of outer portion 52a of the backing plate is an outer annular ferromagnetic clamp 56 for securing target 16. Clamp 56 is also considered a part of the pole weldment assembly and is formed of a material for conducting magnetic flux. Extending beyond surface 16a of target 16 is an outer annular ring 60, held in place by clamp 56, and an inner annular ring 62. The inner ring is positioned adjacent an inner annular region 16b of the outer target, and the outer ring is positioned adjacent an outer annular region 16c of the outer target. Inner ring 62 has an upper annular portion 62a, and outer annular portion 26 of the inner target is disposed adjacent portion 62a. These rings are made of a conventional sputtering material, such as a cobalt-based alloy, and form part of sputtering target 16.

The target assembly is cooled by water which enters through inlet channel 46, travels in channel 48 around a cavity about the inner and outer targets, and exits via an outlet channel 50.

The target assembly is mounted to a sputtering chamber in a sputtering apparatus through mounting flange 64. A high voltage insulator 65 joins flange 64 to the target assembly. A conventional ground shield 66 and hat shield 67 extend circumferentially around the target assembly adjacent the outer ring clamp.

The target assembly may also include a means for placing a negative voltage bias of between −50 and −500 volts on the substrate during sputter deposition. Also included in the assembly, but not shown in the figure, is a DC power source for supplying power to the inner and outer targets.

Figure 2:
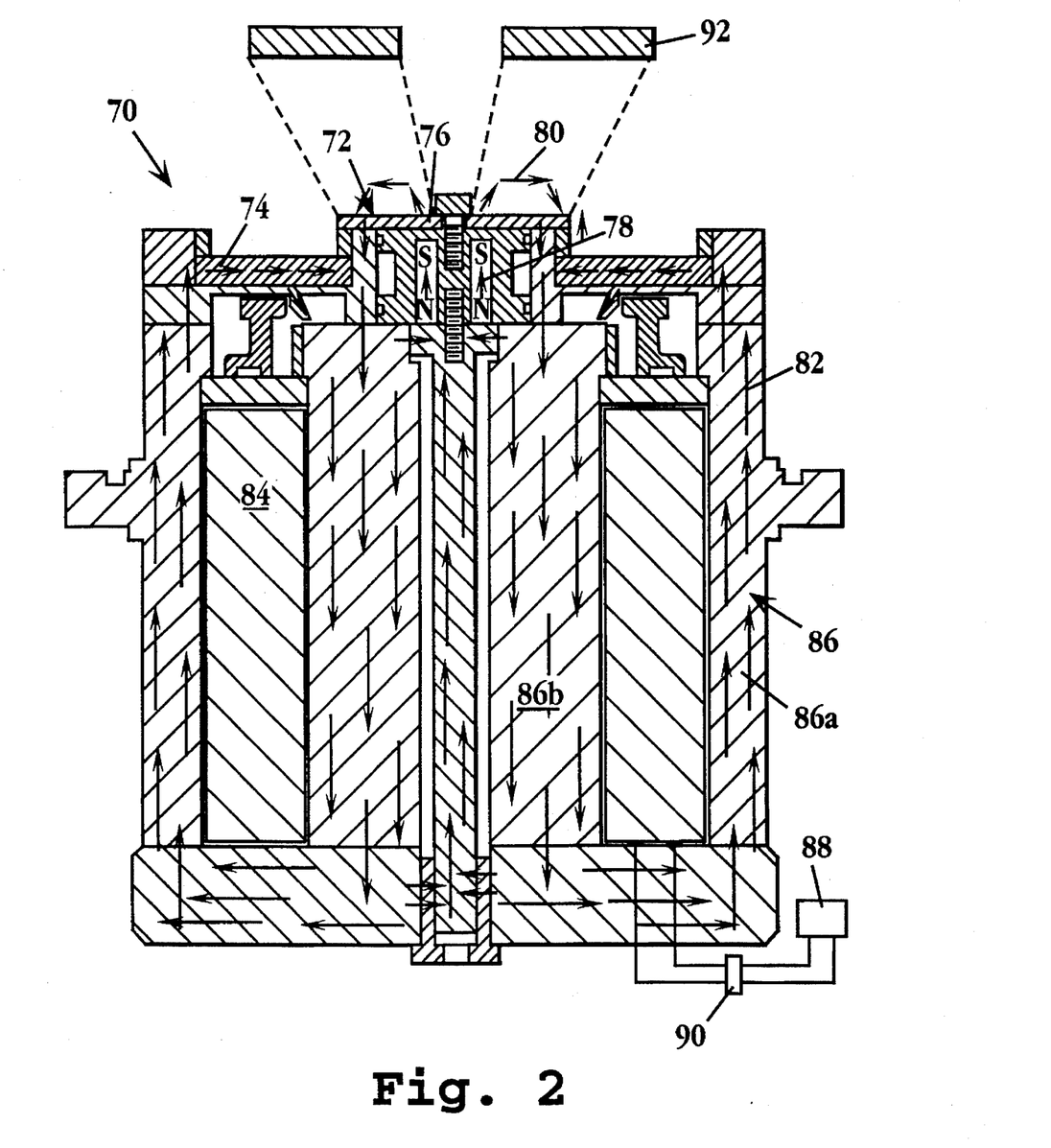
FIG. 2 shows the distribution of magnetic field lines in the target assembly shown in FIG. 1, when the magnetic means are arranged for ignition of the inner target.

Turning now to FIG. 2, a target assembly 70, similar to that described in FIG. 1, is shown in cross section. Target assembly 70 includes an inner sputtering target 72 and an outer sputtering target 74, each having planar sputtering surfaces. Disposed adjacent an inner annular portion 76 of inner target 72 is a permanent magnet 78, having an axial pole orientation, with the south pole designated by an "S" in the figure and the north pole designated by an "N".

Permanent magnet 78 generates a magnetic field along a first path 80, where the magnetic field lines emerge from the permanent magnet at the inner annular portion of the inner target, bend over the surface of the inner target, and re-enter the target again, combining with a second magnetic flux path 82, to be described.

Disposed adjacent the outer target is an electromagnetic coil assembly 84 housed in a pole weldment assembly 86, similar to assembly 28 of FIG. 1, having an outer pole piece 86a and an inner pole piece 86b.

Electromagnet 84 is controlled by a coil source control 88. A conventional relay switch 90 is positioned between the electromagnet and the coil source control. Relay 90 is a 24 V control signal for switching the electromagnet coil polarity, e.g., switching the current direction in the electromagnet coil.

According to an important feature of the invention, at least one of the magnetic means is reversible in magnetic-pole polarity. In this embodiment, where the outer magnetic means is an electromagnet, the orientation of the magnetic poles is reversible by switching the direction of current applied to the electromagnetic coil of the electromagnet. The relay switch toggles between an on and an off position, and in this embodiment, when the relay switch is in the on position, and a low coil current is applied, the magnetic flux produced is sufficient to ignite only the inner target when power is applied to the inner target at a preselected level.

With continuing reference to FIG. 2, the magnetic field lines produced when the magnetic means are arranged for ignition of the inner target are illustrated. The inner magnetic means are oriented as shown in FIG. 2 and as described above to produce flux path 80. Coil source control 88 is adjusted to a low coil current of between about 0.1 and 1.0 amp, more preferably between 0.1 and 0.5 amp, and relay switch 90 is in the on position. Magnetic field 82 is created, which is represented by the arrows, and defined by magnetic flux in a first direction in the outer pole piece, across the outer target, and in an opposite direction along the inner pole piece.

This arrangement of magnetic means, which is effective to create the above described flux paths 80, 82, is referred to herein as reverse polarity.

Importantly, in reverse polarity, the magnetic flux produced is sufficient to ignite a sputtering plasma only in the inner target, when power is supplied at a preselected level from a power source to the inner target. The magnetic flux produced by the electromagnet at a coil current of 0.1 and 1.0 amp is not usually sufficient to ignite a sputtering plasma in the outer target. In this way, material from the inner target can be deposited onto a substrate, such as substrate 92.

Figure 3:
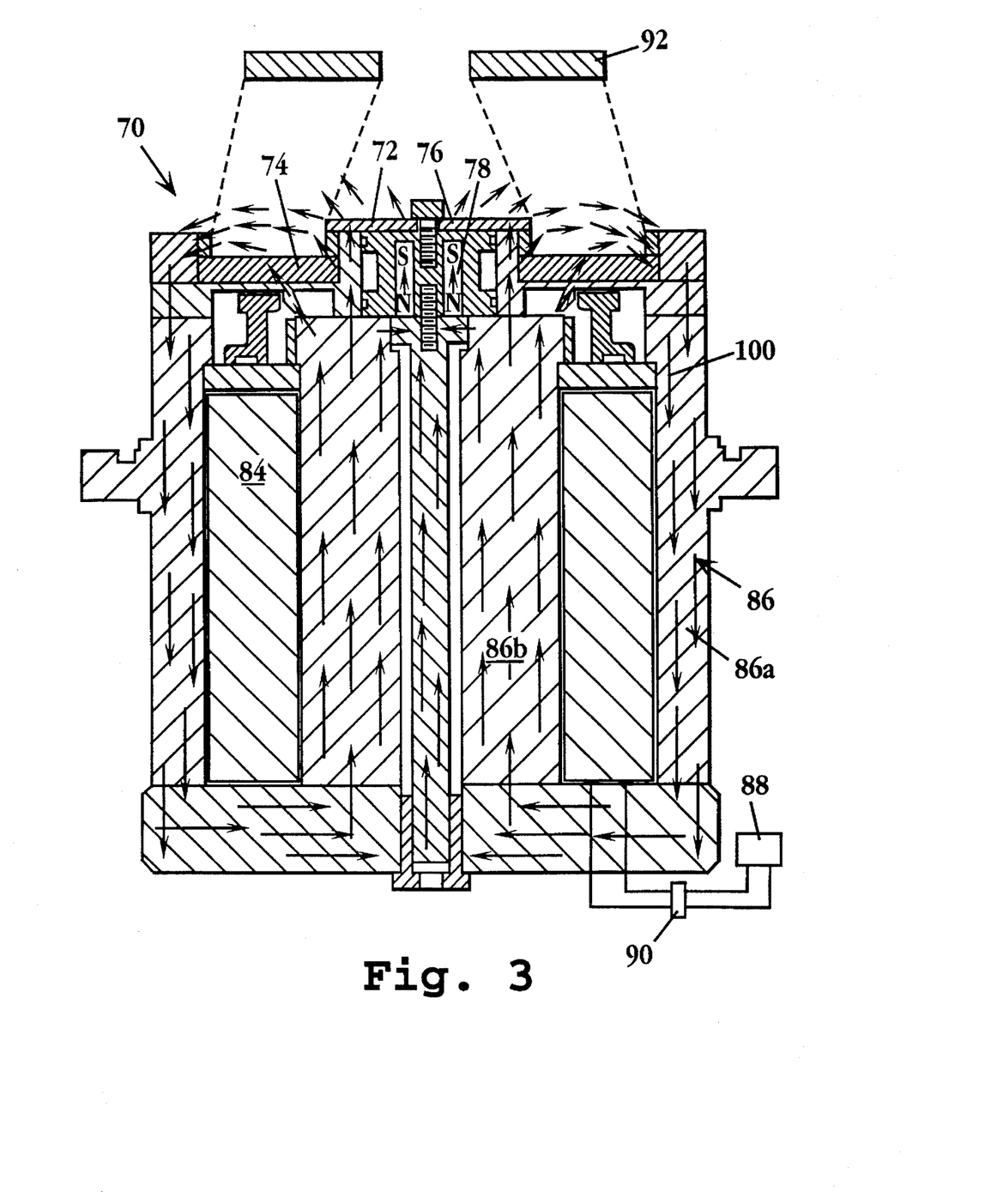
FIG. 3 shows the distribution of magnetic field lines in the target assembly shown in FIG. 1, when the magnetic means are arranged for ignition of the outer target.

FIG. 3 shows the target assembly of FIG. 2, with the outer magnetic means in forward polarity, that is, the outer magnetic means are opposite in polarity from that described with respect to FIG. 2.

Inner magnetic means 78 is oriented as described above, with the magnetic poles in a substantially axial direction with respect to the central axis of the target assembly. Outer magnetic means 84 is controlled by coil source control 88 through relay 90. Relay 90 is in the off position, and a high coil current of between 1.0 and 5.0 amps, more preferably between 1.0 and 3.0 amps, is applied to the electromagnet. A magnetic field is created, as indicated by the arrows in flux path 100. Flux path 100 is defined by magnetic flux in a first direction in inner pole piece 86b, across the outer target, and in an opposite direction along outer pole piece 86a.

Importantly, the magnetic flux generated is sufficient to ignite a sputtering plasma only in the outer target, when power is supplied at a preselected level to the outer target, for deposition of material onto substrate 92. The direction of flux path 100 and its strength prevent formation of a closed magnetic loop about the inner target, such that a sputtering plasma about the inner target does not ignite.

Table 1 shows magnetic flux measurements, in Gauss, taken for the inner and outer targets of the target assembly with the magnetic means in reverse polarity and in forward polarity, as described in FIGS. 2 and 3, respectively. The magnetic flux created by the magnetic means was measured using a Gaussmeter, with the probe parallel to the target surface (in-plane), and with the probe perpendicular to the target surface (out-of-plane).

Magnetic flux was measured with the outer magnetic means in reverse polarity at 0.7 amp and at 1.0 amp. In reverse polarity and at 0.7 amp, the in-plane magnetic flux above the outer target surface was 75 Gauss at the inner diameter pole and 22 Gauss ¼" from the inner diameter pole. The out-of-plane magnetic flux above the inner target surface was +865 Gauss at the inner diameter and −182 Gauss at the outer diameter. The positive and negative values indicate that a closed magnetic loop is present above the surface of the inner target, effective to produce a sputtering plasma in the inner target when power is applied to the target.

In forward polarity and at 0.7 amp, the magnetic flux above the plane of the outer target was 253 Gauss at the inner diameter pole and 100 Gauss ¼ from the inner diameter pole. The magnetic flux above the inner target, measured out-of-plane with respect to the surface of the target, was +1003 Gauss at the inner diameter and +156 Gauss at the outer diameter. The positive values at both inner and outer diameters indicate that there is not a closed magnetic loop above the surface of the inner target when the outer magnetic means is in forward polarity, and the inner target is not ignited when power is applied to the inner target. However, the magnetic field strength above the outer target is sufficient to ignite the outer target when power is supplied to the target.

Similar observations were seen with a coil current of 1.0 amps.

TABLE 1

| Coil Current and Direction | In-Plane, Outer Target, Magnetic Flux (Gauss) | | Inner Target, Magnetic Flux (Gauss) | | |
|---|---|---|---|---|---|
| | I.D. Pole | ¼" from I.D. Pole | Out-of-Plane I.D. | O.D. | In-Plane |
| 0.7 amp, reverse | 75 | 22 | +865 | −182 | 438 |
| 0.7 amp, forward | 253 | 100 | +1003 | +156 | |
| 1.0 amp, reverse | 102 | 40 | +855 | −202 | 465 |
| 1.0 amp, forward | 340 | 125 | +1028 | +206 | |

II. Operating Characteristics

In operation, the sputtering chamber which houses the above described target assembly is evacuated, and an inert sputtering gas, such as argon, is introduced into the chamber to a final pressure of between about 2–20 mTorr typically. Ignition of either the inner target or the outer target, when power is applied to one of the targets, depends on the orientation of the magnetic means.

The inner target is ignited, as described above, when the magnetic means are oriented to produce a closed loop magnetic path about the surface of the inner target. As illustrated in FIG. 2 and supported by the data presented in Table 1, a magnetic loop, where the magnetic field exits the target surface close to the inner diameter pole and reenters the target at the outer diameter surface, is created by the permanent magnet adjacent the inner target. When power is supplied to the target, a sputtering plasma is ignited.

The outer target is ignited by orienting the polarity of the outer magnetic means to be reverse from the polarity effective to ignite the inner target, that is in forward polarity. A coil current between 1.0 and 5.0 amps is applied to the outer magnetic means and power is supplied to the outer target.

In the operations described below, sputtering was carried out using a Varian-MDP-350 (Intevac), Sputtering System (Santa Clara, Calif.), representative of a double-sided, single-disc, high-throughput machine having two interlocking systems, for loading and unloading. The cathode in the apparatus was modified according the present invention, as detailed in Section I. The sputtering chamber was evacuated to pressure of about $10^{-7}$ Torr, and argon gas was introduced into the chamber to a final sputtering pressure of up to 20 mTorr. The outer sputtering target was a cobalt-based target, that is a target containing more than 50% cobalt, such as CoCrTa (84.5/12.5/3.0). The inner sputtering target was composed of chromium.

Figure 4A:
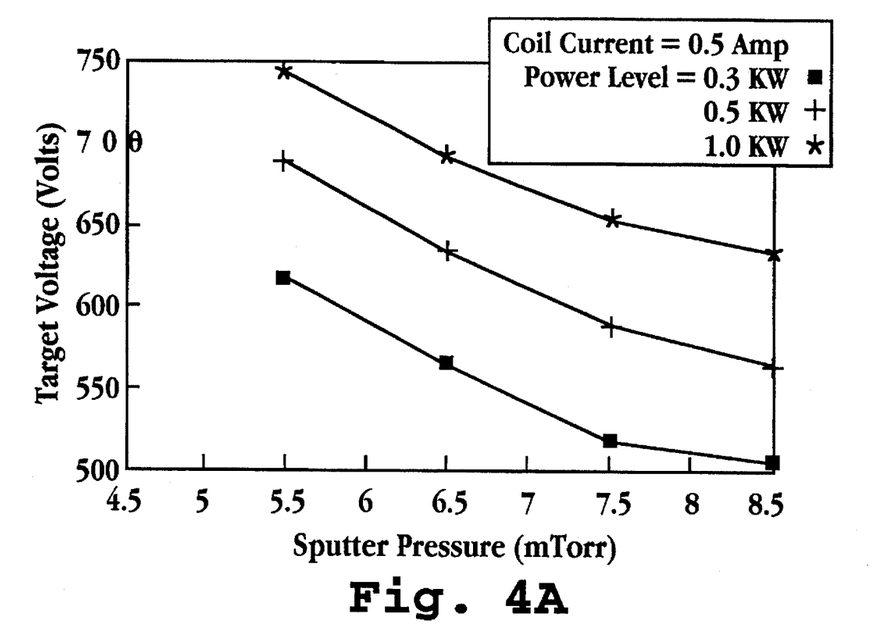
FIGS. 4A and 4B are plots of target voltage as a function of sputtering pressure, in mTorr, for the inner chromium target of the target assembly, with 0.5 amp (FIG. 4A) and 1.0 amp (FIG. 4B) coil current, and a target power at preselected levels of 0.3 KW (■); 0.5 KW (+), and 1.0 KW (*)
Figure 4B:
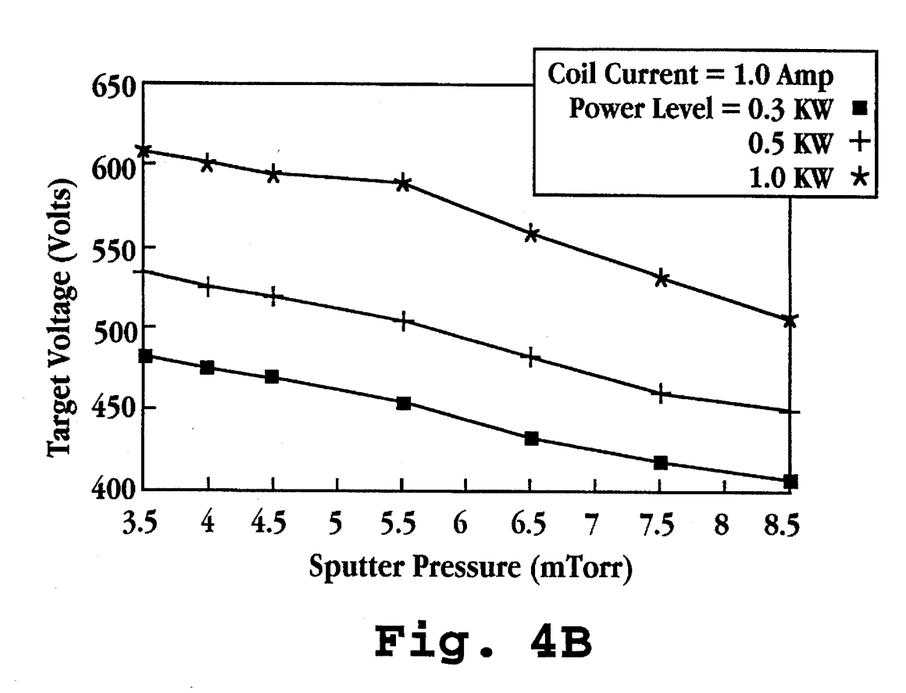
Figure 5:
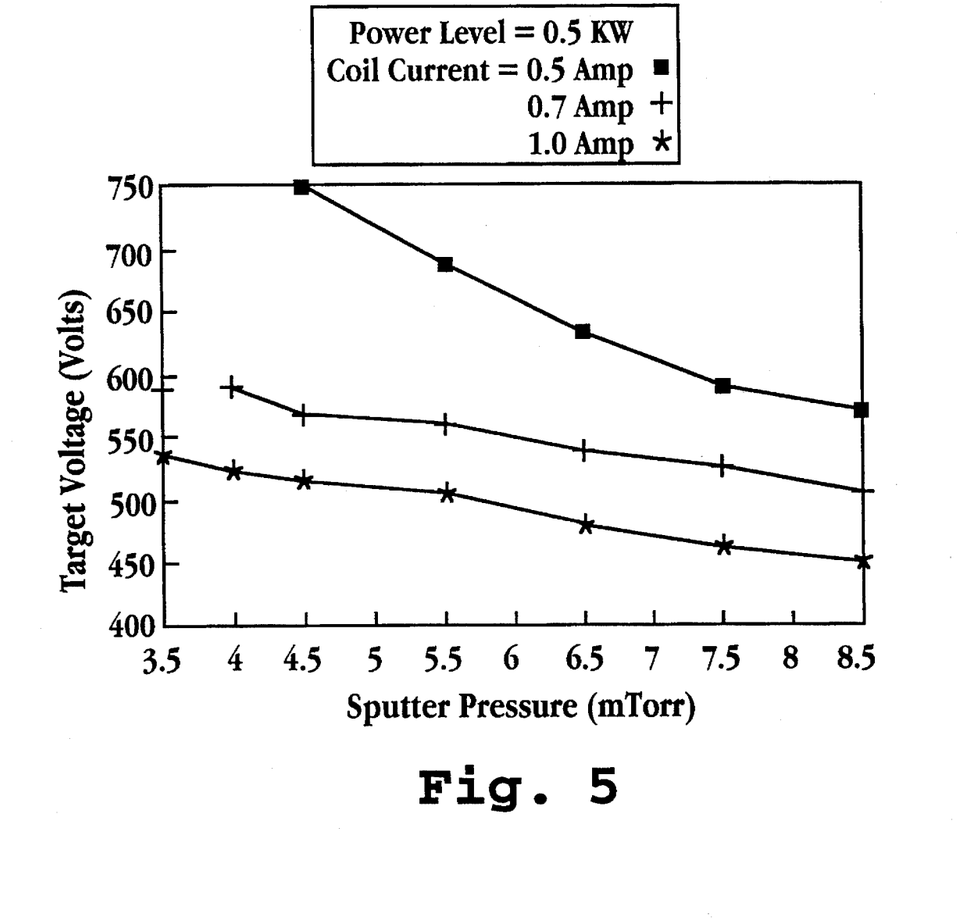
FIG. 5 is a plot of target voltage against sputtering pressure, in mTorr, for the inner chromium target of the target assembly, with the preselected power level of 0.5 kW supplied to the inner target, and with 0.5 amp (■), 0.7 amp (+), and 1.0 amp (*) coil current in the electromagnet.

One measure of sputtering efficiency is the plasma voltage required to ignite the sputtering plasma, at a given chamber gas pressure. FIGS. 4A–4B and FIG. 5 are plots of target voltage, in volts, as a function of sputtering pressure, in mTorr, for the inner chromium target of the target assembly with a coil current of 0.5 amp (FIG. 4A) and 1.0 amp (FIG. 4B) in reverse polarity, and preselected target power levels of 0.3 KW (■); 0.5 KW (+), and 1.0 KW (*).

FIG. 4A shows that plasma ignition of the inner target was achieved, with the coil current at 0.5 amp, at an argon pressure as low as 5.5 mTorr, and at a voltage of between 625 and 750 volts, depending on the target power. For example, at a preselected power level of 0.3 KW (■), and a sputtering pressure of 6.5 mTorr, the inner chromium target was ignited at about 570 volts. At a pressure of 8.5 mTorr, the plasma ignition voltage was down to about 500 volts, at the same preselected power level of 0.3 KW.

As seen by the data in FIG. 4B, when a higher coil current (1.0 amps) is applied, plasma ignition in the inner target is possible at lower sputtering pressures and target voltages, than is possible at 0.5 amp (FIG. 4A). At a preselected target power level of 0.3 KW (■), and a sputtering pressure of 3.5 mTorr, ignition of the inner target was achieved at a target voltage of about 480 mTorr. At higher sputtering pressures (8.5 mTorr) ignition is achieved at about 410 volts, at the same preselected power level of 0.3 KW.

FIG. 5 is a plot similar to FIGS. 4A and 4B, where plasma ignition for the inner chromium target is indicated, when a single preselected target power level of 0.5 KW was supplied to the inner target. A coil current of 0.5 amp (■), 0.7 amp (+), and 1.0 amp (*) was applied, in reverse polarity. As seen, at a higher coil current, target ignition is achieved at lower target voltages for a given sputtering pressure. At a given coil current, target ignition is achieved at lower target voltages as the sputtering pressure increases.

Similar experiments performed for the outer, cobalt-based sputtering target show that target ignition occurs at preselected target powers of between 1.0 and 2.5 KW.

Figure 6:
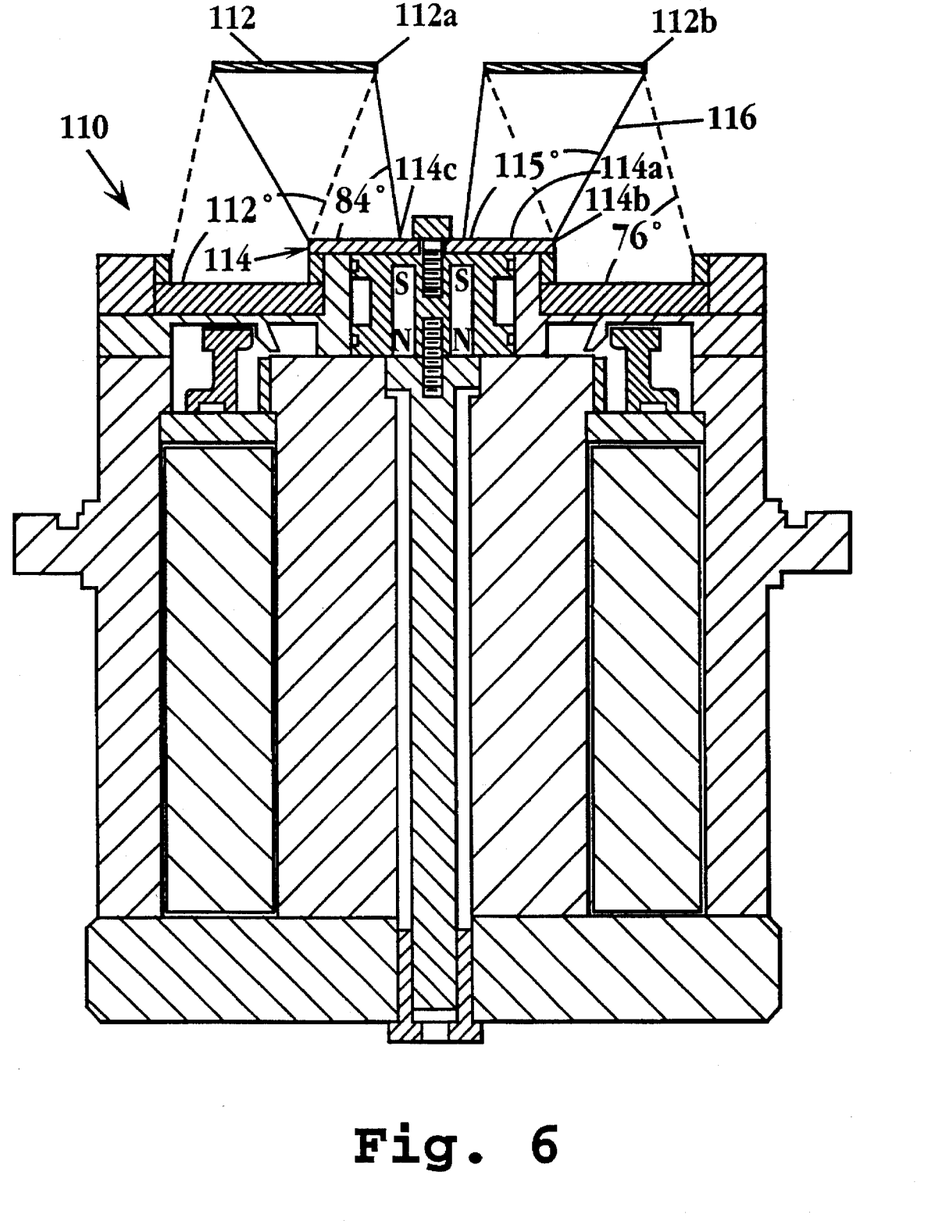
FIG. 6 illustrates the sputtering geometry for the target assembly of FIG. 1 when a substrate is positioned for sputter deposition.

FIG. 6 shows the sputtering geometry for a target assembly 110, constructed in accordance with the present invention and like that shown in FIG. 1, when a substrate 112 is positioned for sputter deposition. When inner target 114 of the assembly is ignited, material is deposited on substrate 112, which is positioned about 1.6 inches from the surface 114a of the inner target. The angle between the inner target surface and the line 116, which connects outer diameter 114b of target 114 and an outer diameter edge region 112b of substrate 112, is approximately 115°. An inner angle of about 84° is present between the inner target surface and the trajectory between an inner edge region 112a of the substrate and an inner region 114c of the inner diameter. Also shown in the figure is the geometry between the substrate and the outer target, where the target-to-substrate distance is 2.0 inches.

Figure 7A:
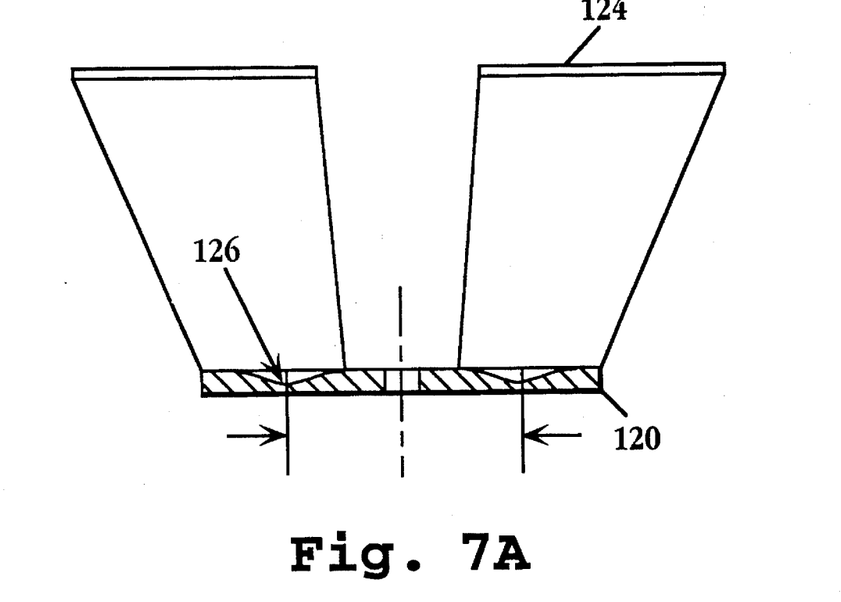
FIGS. 7A and 7B are cross sections of inner (FIG. 7A) and outer (FIG. 7B) sputtering targets in the target assembly of the present invention, both near the end of target usage.
Figure 7B:
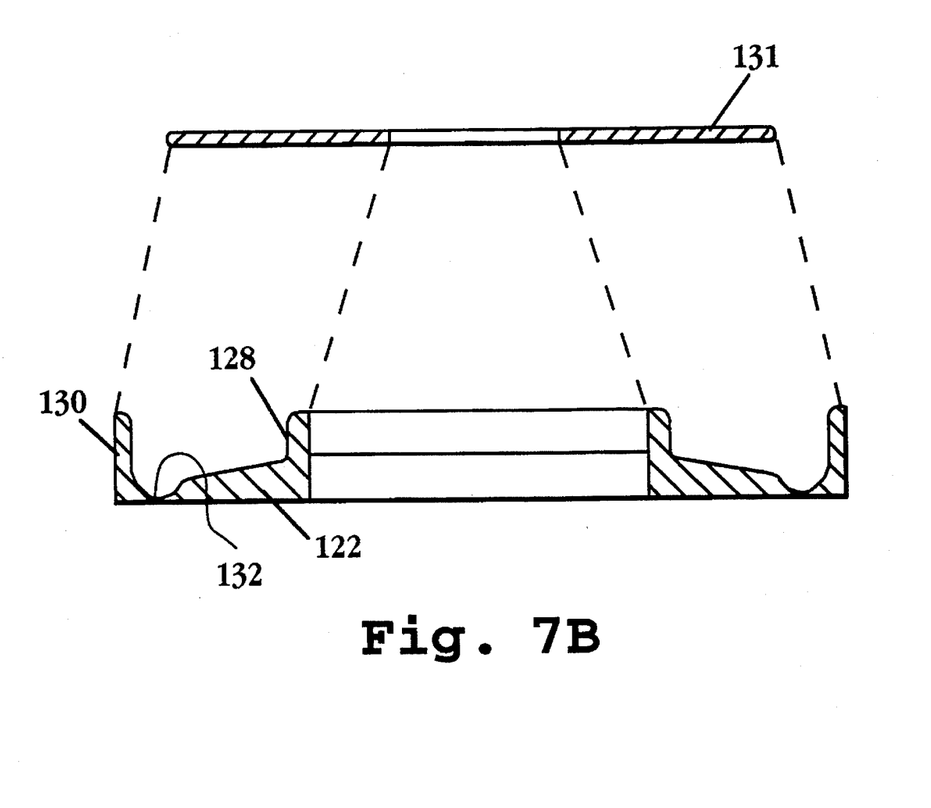

The target utilization of the inner and outer targets is shown in FIGS. 7A and 7B. Seen here are cross sectional profiles of an inner chromium target 120 (FIG. 7A) and an outer cobalt-based target 122 (FIG. 7B) including the target rings, as described above in FIG. 1. The targets shown in FIGS. 7A and 7B are both near the end of target usage.

FIG. 7A illustrates the deposition of target material onto substrate 124 occurs from a relatively narrow center target region 126.

FIG. 7B shows the cross-sectional profile of target 122 and target rings 128, 130, after about 50 kilowatt hours of target sputtering onto substrate 131. The profile shows erosion of material over the entire surface of the target, producing a shallow asymmetrical valley 132 which is centered near the outer region of the target. Some depletion of material is also seen in the raised ring portions of the target. Other features of the sputtering target are described in co-owned U.S. Pat. No. 5,366,607, which is incorporated by reference herein.

III. Method of the Invention

In another aspect, the invention includes a method of forming a magnetic recording medium on a substrate by sputter deposition. In particular, the invention includes a method of forming on a substrate, alternating layers of two different compositions, by sputter deposition using the target assembly described above.

Figure 8:
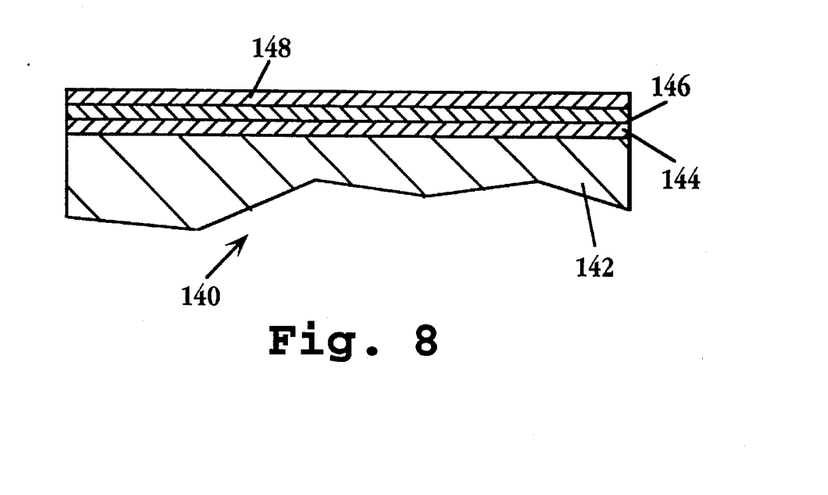
FIG. 8 is a cross-sectional view of a thin-film magnetic disc formed in accordance with the invention.

FIG. 8 shows in cross sectional view, a fragmentary portion of a thin-film medium 140 composed of a rigid disk-like substrate 142, and forming successive thin-film layers over the substrate, an underlayer 144, a magnetic thin-film layer 146, and an overcoat 148.

Substrate 142 may be metallic or non-metallic. Underlayer 144 is preferably crystalline and formed of chromium or of a chromium-based alloy containing at least 50% chromium, such Cr—Si, Cr—V, Cr—Gd, or Cr—Ti. The underlayer is sputtered to a thickness between about 100–3,000 Å.

Magnetic film layer 146 is preferably composed of a cobalt-based alloy and is deposited to a thickness of between 100–800 Å. By cobalt-based alloy is meant an alloy containing at least 50% cobalt. Exemplary binary alloys include Co/Cr or Co/Ni, and exemplary ternary, quaternary, and five-element alloys include Co/Cr/Ta, Co/Ni/Pt, Co/Ni/Cr, Co/Cr/Ta/Pt, Co/Ni/Cr/Pt, and Co/Cr/Ni/Pt/B. A preferred cobalt-based alloy is composed of 80–90% cobalt, 5–20% chromium and 2–10% tantalum. Most preferred alloys include 84.5% cobalt, 12.5% chromium, 3.0% tantalum and 88% cobalt, 8% chromium and 4% tantalum.

Overcoat 148 may be composed of carbon, silicon oxide, silicon nitride, or other suitable material giving wear-resistant, protective properties to the medium.

Medium 140 is formed, in accordance with the method of the invention, by placing the substrate in a sputtering apparatus having a series of sputtering chambers, where at least one of the sputtering chambers has a target assembly like that described in FIG. 1. Sputtering apparatus are commercially available from various sources, such as Circuits Processing Apparatus (Fremont, Calif.), Leybald Heraeus (Germany), VACTEK (Boulder, Colo.), Materials Research Corp (Albany, N.Y.), Varian/Intevac (Santa Clara, Calif.) or Anelva (Japan). These systems are all double-sided, in-line, high-throughput machines having two interlocking chambers for loading and unloading. The sputtering chambers of these systems can be modified to accommodate the target assembly of the present invention.

In operation, the substrate is initially passed through a heating station having a plurality of infrared lights which are arrayed for heating both sides of a substrate.

Downstream of the heating station is a first sputtering station having the target assembly of the present invention. The target assembly has an inner target composed of chromium and an outer target composed of a cobalt-based alloy. An inner magnetic means in the form of a permanent magnet is disposed adjacent the inner target, and an outer magnetic means in the form of an electromagnet is disposed adjacent the outer target.

A first layer, in this embodiment, a chromium underlayer, such as underlayer 144 of medium 140, is formed on the substrate by sputtering from the inner chromium target. Ignition of a sputtering plasma in the inner target is achieved, in the presence of a DC potential across the target, by orienting the polarity of the magnetic means to produce a magnetic flux sufficient to ignite the inner target, as described above in FIG. 2. After deposition of the chromium underlayer to the desired thickness, the magnetic recording layer is deposited, with the substrate remaining in the same sputtering chamber. Ignition of the outer, magnetic target is accomplished by orienting the polarity of one of the magnetic means to be opposite from the orientation for ignition of the inner target, that is, the polarity is reversed, as described above with respect to FIG. 3. Sputter deposition of the second layer, in this embodiment a cobalt-based magnetic recording layer, such as layer 146 of medium 140 (FIG. 8), is accomplished.

Deposition of a wear-resistant overcoat is performed by shuttling the coated substrate to a second sputtering chamber downstream from the first chamber. A pair of targets composed of carbon, silicon nitride, or other suitable protective material, are positioned in the chamber for deposition of the overcoat.

Experiments done in support of the invention, described below in Section IV, show that media formed using the target assembly of the present invention have improved recording properties, compared to media formed conventionally by sputtering each layer in the medium in a separate sputtering chamber.

In another embodiment, the invention includes formation of a recording medium having multiple magnetic thin-film layers. In this embodiment, the chromium underlayer and a first magnetic thin-film layer are deposited as described above. The substrate remains in the sputtering chamber, and the inner chromium target is ignited again, as described above, for deposition of a chromium interlayer over the first magnetic thin-film layer. The chromium interlayer is deposited to a thickness of between 5–50 Å. A second magnetic thin film layer is then deposited by igniting the outer magnetic target. Ignition of the inner and outer targets can be repeated as many times as desired to form a multilayer magnetic recording medium.

It will be appreciated that the inner and outer targets of the target assembly can be of compositions other than chromium and cobalt-based. For example, the outer target may be composed of a magnetic alloy and the inner target composed of graphite, for deposition of a magnetic recording layer and a protective carbon overcoat. It is also possible to place a mask or shield over the outer target, and to sputter an overcoat having a gradient in thickness.

IV. Magnetic Recording Medium Properties

This section describes the magnetic recording characteristics of a medium formed in accordance with the method of the invention, using the target assembly described above.

Magnetic recording media were fabricated by depositing on a nickel-plated aluminum substrate a chromium underlayer and a CoCrTa (84.5/12.5/3.0) recording layer. These layers were deposited in a single sputtering chamber from the inner and outer targets of a target assembly like that described above.

Multilayer recording media were prepared by depositing on a nickel-plated aluminum substrate a chromium underlayer in a first sputtering chamber. In a second sputtering chamber, a CoCrTa (84.5/12.5/3.0) recording layer, a chromium interlayer, and a second CoCrTa recording layer were deposited using a target assembly having an inner chromium target and an outer CoCrTa target. Alternatively, media were formed by sputtering both the chromium underlayer and the chromium interlayer from the inner target of the target assembly.

Media prepared in accordance with the method of the invention are designated in the tables and figures below as "new, one-chamber" media.

For comparison, conventional monolayer and multilayer media were formed from the same materials by sputtering each layer in a separate sputtering chamber. Media prepared in this conventional manner are designated in the tables and figures below as "conventional, two-chamber" media.

Table 2 compares the static magnetic properties of media prepared conventionally to media prepared using the target assembly of the present invention. Each medium had a chromium underlayer with a thickness of 350 Å, and a bias of −500 volts was applied to the substrate during deposition of the layers. The medium prepared using the target assembly of the present invention (new, one-chamber process) have a 29% higher coercivity than the medium prepared conventionally, at similar magnetic remanence thickness ($M_r t$).

TABLE 2

| Medium | Cr Underlayer Thickness | Substrate Bias | Coercivity (Oe) | SR | Mrt (Gμm) |
|---|---|---|---|---|---|
| Conventional, 2 chamber | 350 Å | −500 V | 2049 | 0.88 | 139 |
| New, 1 chamber | 350 Å | −500 V | 2637 | 0.86 | 137 |

In another experiment, two media were prepared conventionally and two media were prepared using the target assembly of the present invention. Full-surface coercivity mapping by a magneto-optics system was used to determine surface uniformity. The results are summarized in Table 3, which shows the coercivity of both sides of the discs (A-side and B-side) for the four media. The A-side of the discs prepared by the new, one-chamber process using the target assembly of the present invention have a higher coercivity, and, importantly, are more uniform across the surface. Surface uniformity is indicated by the lower standard deviation and range of coercivity, relative to the media prepared conventionally. The same results were observed for the B-side of the discs.

Figure 9:
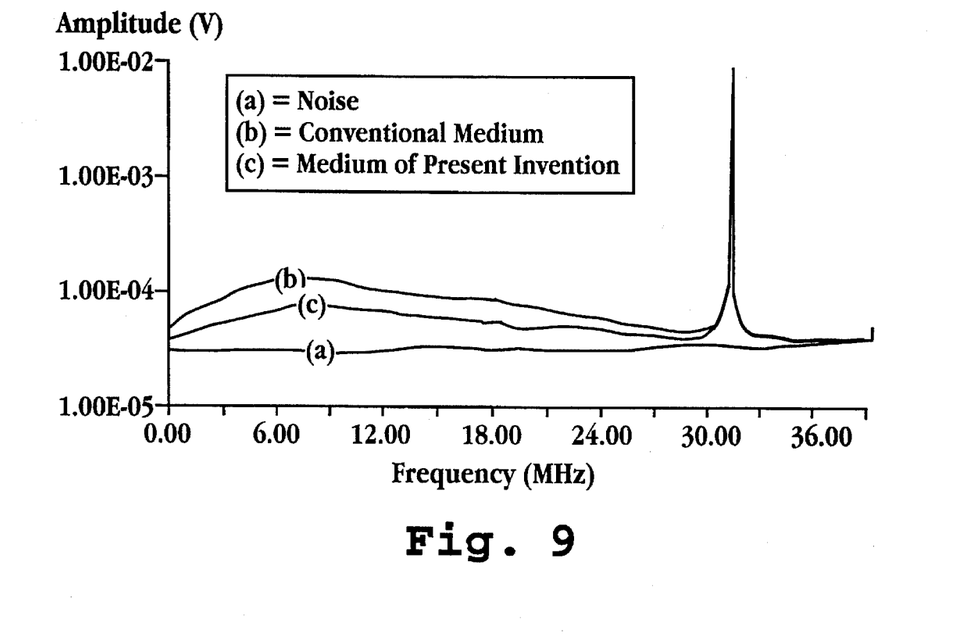
FIG. 9 is a noise spectrum for a medium prepared according to the method of the invention (c), for a medium prepared conventionally (b), and for the head and electronics of the system (a)

Media noise and signal-to-noise ratio were measured as described in Example 1. FIG. 9 shows the noise spectra for a medium sputtered conventionally (b) and for a medium sputtered using the target assembly of the present invention (c). Spectrum (a) represents the noise from the head and the electronics, measured with the head lifted away from the disc. The medium prepared using the target assembly of the present invention has a lower noise amplitude over the frequency range tested (0.60 MHz to 40.0 MHz).

TABLE 3

| Medium | | Chromium Underlayer Thickness | Substrate Bias | Mrt (Gμm) | Coercivity (Oe) | | | | | |
|---|---|---|---|---|---|---|---|---|---|---|
| | | | | | A-Side | | | B-Side | | |
| | | | | | Avg. | Std Dev. | Range | Avg. | Std. Dev. | Range |
| Conventional, two chamber | A | 500 Å | −500V | 145 | 2070 | 68.8 | 256 | 2061 | 78.4 | 284 |
| | B | 400 Å | −300V | 145 | 2045 | 61.1 | 213 | 2079 | 55.0 | 301 |
| New, one chamber | C | 250 Å | −500V | 136 | 2297 | 18.4 | 100 | 2305 | 25.5 | 119 |
| | D | 350 Å | −500V | 137 | 2362 | 41.8 | 153 | 2380 | 45.2 | 182 |

Figure 10:
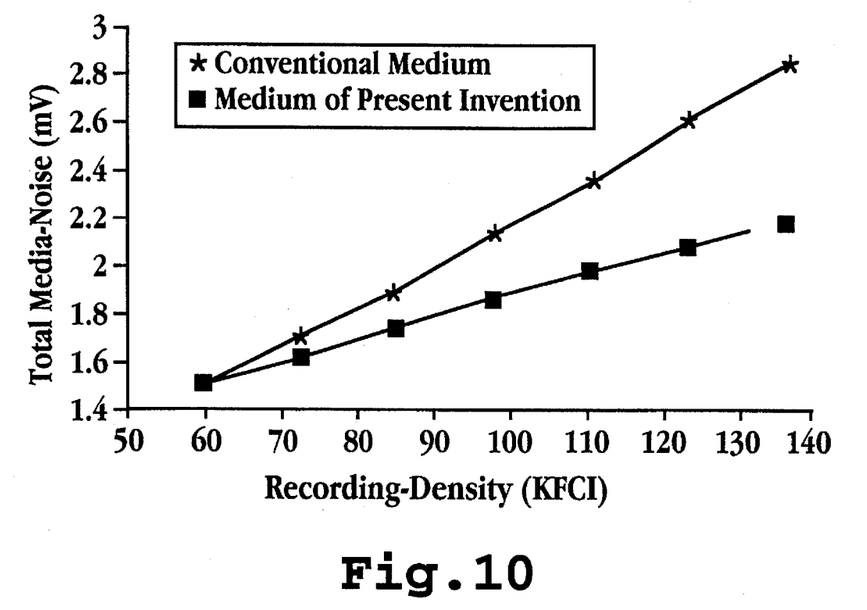
FIG. 10 shows total media noise, in mV, as a function of linear recording density, in kiloflux changes per inch (KFCI) for media prepared conventionally (+) and for media prepared according to the method of the invention (■)
Figure 11:
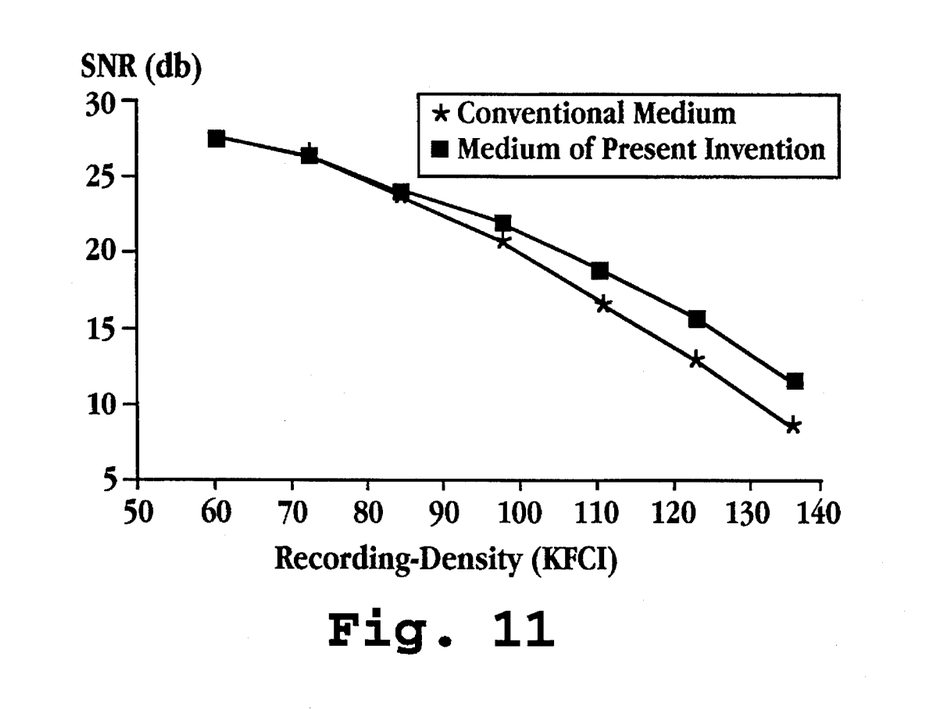
FIG. 11 shows signal-to-noise ratio, in dB, as a function of linear recording density, in KFCI, for media prepared conventionally (+) and for media prepared according to the method of the invention (■)

FIGS. 10 and 11 show total media noise (FIG. 10) and signal-to-noise ratio (FIG. 11) as a function of linear recording density for media prepared conventionally (+) and for media prepared according to the method of the invention (■). A lower media noise and a higher signal-to-noise ratio is observed for media prepared using the target assembly described above.

Figure 12:
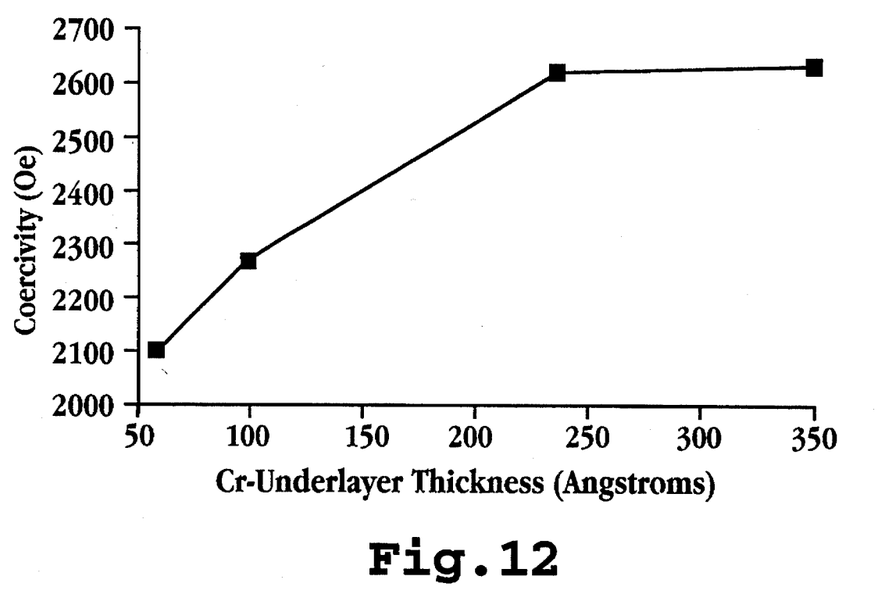
FIG. 12 is a plot of coercivity, in Oe, as a function of thickness of the chromium underlayer, in Å, for media prepared using the target assembly of the present invention.
Figure 13:
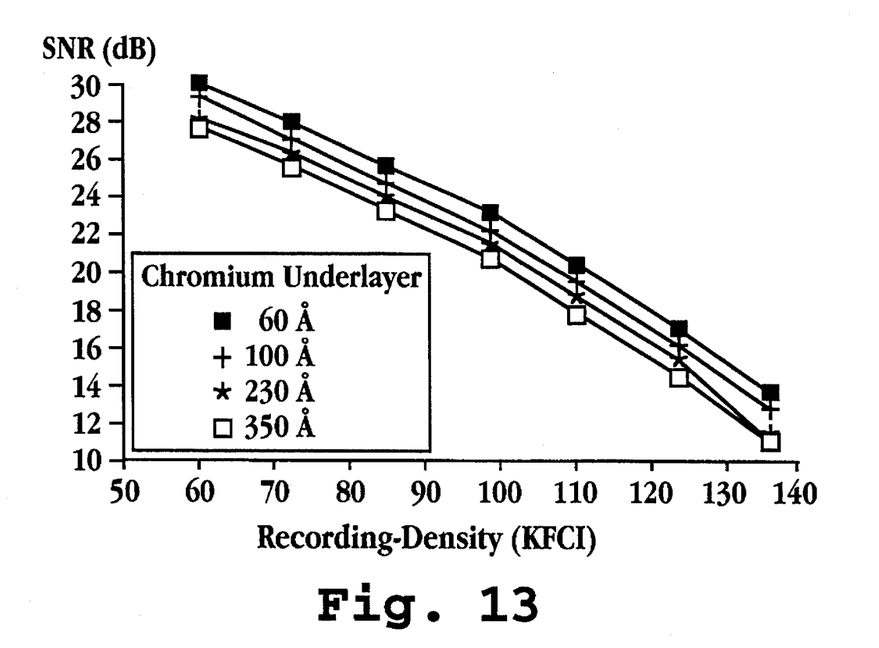
FIG. 13 shows signal-to-noise ratio as a function of recording density, in KFCI, for media prepared according to the method of the invention, where the chromium underlayer is sputtered to a thickness of 60 Å (■), 100 Å (+), 230 Å (*), and 350 Å (□).

In FIGS. 12 and 13, the recording properties of media having a range of chromium underlayer thicknesses were characterized. Media were fabricated using the target assembly of the present invention, where the thickness of the chromium underlayer deposited by the inner target was varied by controlling the sputtering time. The CoCrTa magnetic recording layer was deposited from the outer target, as described above. FIG. 12 shows coercivity as a function of thickness of the chromium underlayer, in Å. The coercivity increases as the thickness of the underlayer increases from about 50 to 230 Å.

Media signal-to-noise ratio as a function of recording density, in KFCI, is shown in FIG. 13. Media having a chromium underlayer thickness of 60 Å (■) have higher signal-to-noise ratio, than media with thicker chromium underlayer thicknesses of 100 Å (+), 230 Å (*), and 350 Å (□).

From the foregoing, it can be appreciated how various features and objects of the invention are met. The target assembly of the present invention is used to form on a substrate first and second sputter-deposited layers having different compositions. In a single sputtering chamber, a first layer of chromium is deposited on the substrate, followed by deposition of a second layer, such as a magnetic recording layer.

The target assembly has inner and outer concentric targets, each having a magnetic means. One of the magnetic means is reversible in magnetic-pole polarity, so that in one orientation the inner target is ignited when power is supplied to it, and in the opposite orientation, the outer target is ignited when power is supplied.

The target assembly and method of fabricating recording media provide a means of sputtering multiple layers in a single sputtering station, reducing the dwell time between layer deposition and decreasing the material inventory required. Media fabricated by the target assembly of the invention have improved recording properties, such as increased coercivity.

EXAMPLE 1

Media noise was measured using a Guzik 1011 T/W tester, with a HP 5385A spectrum analyzer, and noise was calculated by integration from 0 to 40 MHz. A thin-film inductive write head, having a gap length of 0.35 µm, and a shielded magnetoresistive (MR) read element, having a gap length of 0.35 µm and track width of 6 µm were employed. The head flying height on a 95 mm disk rotating at 5400 rpm, with a linear velocity of 470 ips, was in the range of 2.8–3.5 micro-inches. The intrinsic media-noise voltage was obtained by subtracting the electronics and head-noise voltage acquired with the head unloaded from the disk surface. Signal amplitude was determined by averaging digitized waveforms. Signal-to-noise ratio at a given transition was derived by dividing the rms noise voltage at that density by the zero-to-peak signal amplitude of an isolated transition.

In the spectra shown in FIG. 9, spectrum (a) shows the noise from the head and electronics, collected with the head lifted away from the disk. Spectra (b) and (c) are from a track with a single written frequency at 32 MHz for the media sputtered by the conventional two-chamber process (b) and by the one-chamber process (c) using the target assembly of the present invention, respectively.

Although the invention has been described with respect to particular embodiments, it will be apparent to those skilled in the art that various changes and modifications can be made without departing from the invention.

It is claimed:

1. A target assembly for use in forming on a substrate, first and second sputter-deposited layers having different compositions, said assembly comprising:

inner and outer concentric targets for sputter depositing said layers on the substrate, inner magnetic means disposed adjacent an inner annular portion of said inner target, and having a substantially axial magnetic pole orientation, outer magnetic means disposed adjacent the outer target and an outer annular region of the inner target, and having a substantially radial magnetic pole orientation, at least one of said magnetic means being reversible in magnetic-pole polarity, wherein one polarity produces a magnetic flux sufficient to ignite a sputtering plasma in the inner target only, when power is supplied to the inner target at a preselected level, and the opposite polarity produces a magnetic flux sufficient to ignite a sputtering plasma in the outer target only, when power is supplied to the outer target at a preselected level.

2. The assembly of claim 1, wherein said inner magnetic means is a permanent magnet and said outer magnetic means is an electromagnet.

3. The assembly of claim 2, wherein said electromagnet in said one polarity has a current of between 0.1 and 1.0 amp, and in said opposite polarity has a current of between 1.0 and 5.0 amps.

4. The assembly of claim 1, wherein said inner target is composed of chromium and said outer target is composed of a cobalt-based alloy.

5. The assembly of claim 1, wherein said outer target further includes an inner ring and an outer ring, both formed of substantially the same material as said outer target, the inner ring being positioned adjacent an inner annular region of said outer target, and said outer ring being positioned adjacent an outer annular region of said outer target.

6. The assembly of claim 5, wherein an outer annular portion of said inner target is disposed adjacent an upper annular portion of said inner ring.

7. The assembly of claim 1, further comprising a means for placing a negative bias of between −50 to −500 volts on said substrate during sputter deposition of said layers.

8. A method of forming on a substrate by sputter deposition, alternating layers of two different compositions, said method comprising:

placing said substrate in a sputtering chamber having a target assembly with inner and outer concentric targets, and having inner and outer magnetic means disposed adjacent said inner and outer targets, respectively, where at least one of said magnetic means is reversible in magnetic-pole polarity, and one polarity produces a magnetic flux sufficient to ignite a sputtering plasma in the inner target only, and the opposite polarity produces a magnetic flux sufficient to ignite a sputtering plasma in the outer target only, orienting the polarity of one of said magnetic means to achieve ignition of a sputtering plasma in the inner target, when power is supplied to the inner target at a preselected level;

sputtering from said inner target, a layer onto said substrate;

reversing the polarity of said one magnetic means to achieve ignition of a sputtering plasma in the outer target, when power is supplied to the outer target at a preselected level; and sputtering from said outer target, a layer directly on the layer sputtered from said inner target.

9. The method of claim 8, wherein said orienting is accomplished by controlling a coil current amperage and direction in said outer magnetic means.

10. The method of claim 9, wherein said controlling includes adjusting in an electromagnet said coil current amperage to between about 0.1–1.0 amp.

11. The method of claim 8, wherein said reversing is accomplished by controlling a coil current amperage and direction in said outer magnetic means, which is in the form of an electromagnet, and said coil current amperage is adjusted to between about 1.0–5.0 amps.

12. The method of claim 8, wherein said sputtering from said inner target is from a chromium inner target, and said sputtering from said outer target is from a cobalt-based alloy outer target.

13. The method of claim 12, wherein said sputtering steps are effective to form a magnetic recording medium having at least two magnetic thin-film layers separated by a chromium interlayer layer having a thickness of between 5–50 Å.

14. The method of claim 12, wherein said sputtering from said inner target is effective for deposition of a chromium underlayer and for deposition of a chromium interlayer in a magnetic recording medium.

15. The method of claim 8, wherein said orienting includes supplying power to the inner target at the preselected level of between 0.3–1.0 KW.

16. The method of claim 8, wherein said reversing includes supplying power to the outer target at the preselected level of between 1.0–2.5 KW.

17. A method for forming on a substrate a magnetic recording medium having at least two sputtered layers of different compositions, an improvement for enhancing the coercivity of the medium, comprising, sputtering said layers from a target assembly having inner and outer concentric targets, and having inner and outer magnetic means disposed adjacent said inner and outer targets;

orienting the polarity of at least one of said magnetic means to achieve ignition of a sputtering plasma in the inner target only, when power is supplied to the inner target at a preselected level; and reversing the polarity of said one magnetic means to produce a magnetic flux sufficient to ignite a sputtering plasma in the outer target only, when power is supplied to the outer target at a preselected level.

* * * * *